United States Patent [19]

Dansky et al.

[11] Patent Number: 4,668,879

[45] Date of Patent: May 26, 1987

[54] DOTTED "OR" FUNCTION FOR CURRENT CONTROLLED GATES

[75] Inventors: Allan H. Dansky, Poughkeepsie, N.Y.; Martine M. F. Savalle, Vence, France; Helmut Schettler, Dettenhausen, Fed. Rep. of Germany

[73] Assignee: International Business Machines Corporation, Armonk, N.Y.

[21] Appl. No.: 827,391

[22] Filed: Feb. 10, 1986

[51] Int. Cl.$^4$ .................... H03K 17/26; H03K 19/082
[52] U.S. Cl. .................................. 307/454; 307/443; 307/446; 307/456; 307/246; 307/291
[58] Field of Search .................. 307/200 A, 443, 446, 307/454, 455–458, 460, 542, 544, 549, 551, 558, 559, 565, 246, 272 R, 272 A, 280, 281, 285, 291–292, 317 R, 317 A, 319, 320

[56] References Cited

U.S. PATENT DOCUMENTS

| | | | |
|---|---|---|---|
| 3,450,896 | 6/1969 | Taniguchi et al. | 307/297 X |
| 3,505,535 | 4/1970 | Cavaliere | 307/455 |
| 3,614,467 | 10/1971 | Tu | 307/456 X |
| 3,814,953 | 6/1974 | Malaviya | 307/272 A X |
| 4,215,418 | 7/1980 | Muramatsu | 364/757 X |
| 4,251,737 | 2/1981 | Gaudenzi | 307/454 X |
| 4,319,148 | 3/1982 | Malaviya | 307/471 X |
| 4,376,900 | 3/1983 | Metzger | 307/473 |
| 4,424,455 | 1/1984 | Neely | 307/446 X |
| 4,529,896 | 7/1985 | Grandguillot et al. | 307/443 X |
| 4,605,870 | 8/1986 | Dansky et al. | 307/443 |

OTHER PUBLICATIONS

Dansky et al, "Active Pull-Down Circuit for Current-Controlled Gate", IBM TDB, vol. 24, No. 11A, 4-1982, pp. 5613–5618.
Dansky et al, "Current-Controlled Gate Push-Pull Dotting", IBM TDB, vol. 24, No. 6, 11-1981, pp. 3031–3034.
Pollmann et al, "Protection Circuit for Tristate Push-Pull Drivers", IBM TDB, vol. 26, No. 7B, 12-1983, pp. 3675–3677.

Primary Examiner—Stanley D. Miller
Assistant Examiner—D. R. Hudspeth
Attorney, Agent, or Firm—Stanger, Michaelson and Einschlag

[57] ABSTRACT

A "dotted or" logic circuit comprising Current Controlled Gate (CCG) circuits is described. In accordance with the present invention, Schottky diodes are cross-coupled between the dotted CCG circuits. Specifically, a Schottky diode is connected between the base of the base-to-collector diode of one CCG circuit to the emitter of the input transistors of another CCG circuit and vice versa.

9 Claims, 3 Drawing Figures

CURRENT CONTROLLED GATE CIRCUIT (CCG)

CURRENT CONTROLLED GATE CIRCUIT (CCG)

DOTTED "OR" FUNCTION FOR CURRENT CONTROLLED GATES

BACKGROUND OF THE INVENTION

The present invention pertains to semiconductor digital circuits known as current controlled gates.

The capability of a logic circuit to drive heavy loads, e.g., high fan-out and/or output capacitance, is highly desirable. A push-pull driver has been frequently used in the art to efficiently provide this capability.

One such circuit, a current controlled gate (CCG) circuit, comprises an emitter follower and an AC coupled pull-down output used in a push-pull configuration. Such a CCG circuit is disclosed in an article entitled "Active Pull-Down Circuit For Current-Controlled Gate" by A. H. Dansky and J. P. Norsworthy, *IBM Technical Disclosure Bulletin*, Vol. 24 No. 11A April 1982, pp. 5613–5618 and in U.S. patent application Ser. No. 478,613, filed Mar. 25, 1983.

A highly desirable feature for a logic circuit to possess is the "dot", also known as the "dot or", logic function. The "dot" is the merging of two levels of logic into one level of logic by simply connecting the outputs of two or more circuits together to provide the logical "or" of the outputs. The logic power of CCG circuits would be increased if such circuits could be dotted. Without the dot, one would require an additional level of logic to merge logic states. In addition, the "dot" is needed to build a latch from CCG circuits.

Unfortunately, push-pull circuits such as the CCG, operate poorly when the outputs of two or more circuits are dotted. In particular, when CCG outputs are dotted, transitions between certain input states cause an active pull-up to work against an active pull-down. When this occurs, high levels of current flow in the CCG circuits and unaffordably high amounts of power are dissipated. Furthermore, in the case of the CCG circuit, spikes on the output occur during transitions between certain input states when the output should not change.

SUMMARY OF THE INVENTION

CCG circuits can advantageously be dotted in accordance with embodiments of the present invention in such a manner as to prevent high currents and spikes on the output during transitions between certain input states.

In accordance with the present invention, Schottky diodes are cross-coupled between dotted CCG circuits. Specifically, a Schottky diode is connected between the base of the base-to-collector coupling diode of one CCG circuit to the emitter of the input transistors of another CCG circuit and vice versa.

The cross-coupled Schottky diodes discharge the diffusion capacitance of the base-to-collector diodes. This, in turn, prevents the active pull-down devices from operating during the transition between certain input states. As a result, high currents are not coupled into active pull-downs and the dotted output has no spikes.

In addition, in accordance with the present invention, an inventive latch circuit comprising dotted CCG circuits includes a Schottky diode to discharge the diffusion capacitance of base-to-collector diodes.

BRIEF DESCRIPTION OF THE DRAWING

A complete understanding of the present invention may be gained by considering the following detailed description in conjunction with the accompanying drawing, in which.

To facilitate reader understanding, identical reference numerals are used to designate elements common to the figures.

DETAILED DESCRIPTION

Before describing the inventive dotted CCG circuit, we will briefly describe the CCG circuit itself to provide a framework for understanding the present invention.

Figure 1:
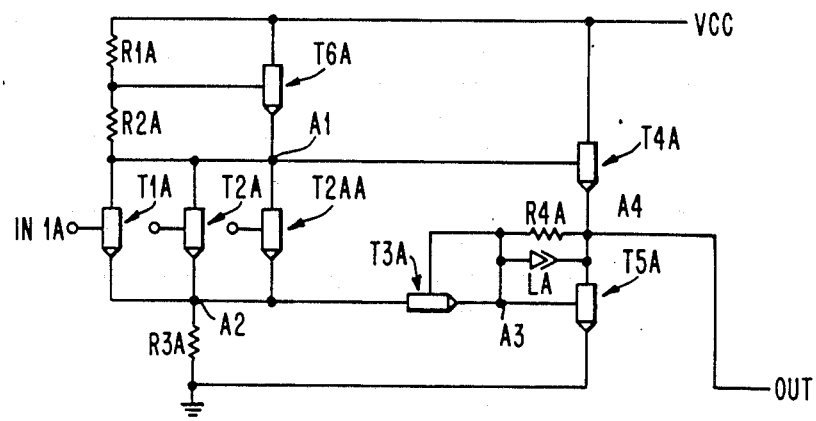
FIG. 1 shows, in pictorial form, a circuit diagram of a CCG circuit.

FIG. 1 shows an embodiment of a CCG circuit. We will first describe operation of this CCG circuit in its two DC states. After that we will describe the operation of the circuit during transitions between these DC states.

For purposes of the following discussion, assume that an UP level or a logical "1" corresponds to a voltage of approximately 1.35 v, a DOWN level or a logical "0" corresponds to a voltage of approximately 0.55 v, and the power supply voltage for the circuit, Vcc, corresponds to a voltage of approximately 2.1 v. It should be clear to those skilled in the art that these particular values are merely chosen for the convenience of the discussion and can be varied by suitable circuit design without departing from the spirit of the invention.

In addition, to simplify the discussion, the input level applied to transistors T2A and T2AA, in all cases, will be taken to be a DOWN level. Because of this, since the CCG circuit performs a NOR logical function, it will act as an inverter with respect to the input level applied to the base of transistor T1A. Thus, the input to T1A will determine the circuit output level at node A4.

DC State for Input=UP Level

When the input level applied to transistor T1A is an UP level, i.e. 1.35 v, the circuit output, i.e. voltage VA4 at node A4, will be a DOWN level, i.e. 0.55 v. Since the input at the base of transistor T1A is 1.35 v, T1A is "on." Taking the base-to-emitter voltage of T1A to have a value of 0.75 v, voltage VA2 at node A2 is 0.6 v.

The anti-saturation clamp network comprising resistors R1A and R2A, and transistor T6A is described in U.S. Pat. No. 3,505,535. This clamp carries the same current as T1A and voltage VA1 at node A1 is 1.1 v.

In this CCG circuit, resistor R4A has a much larger value than resistor R3A—typically R4A is of the order of ten times as large as R3A. As an example, let us chose R4A equal to 64,000 ohms and R3A equal to 6,400 ohms.

Since the circuit output at node A4 is a DOWN level, voltage VA4 at node A4 is 0.55 v. This causes the collector current through transistor T4A to be approximately 0.09 ua (Such a value results because npn transistors of the type used herein have the property that their collector current, Ic, drops by approximately half for every drop of 20 mv in the base-to-emitter voltage and approximately doubles for every increase of 20 mv in the base-to-emitter voltage. For the transistors used herein, Ic=100 ua when the base-to-emitter voltage is approximately 0.75 mv. Thus, when the base-to-emitter voltage drops from 0.75 mv to 0.55 mv, Ic drops from 100 ua to approximately 0.09 ua).

If all the current flowing through transistor T4A also flowed through resistor R4A, the drop across R4A would be about 0.064 mv. Thus, voltage VA3 at node A3 would be approximately 0.55 mv. Since voltage VA2 at node A2 is 0.6 v and voltage VA3 at node A3 is 0.55 v, base-to-collector diode T3A is "off." As a result the capacitance of base-to-collector diode T3A is low, being due to junction capacitance alone, and has a value on the order of 0.1 pf. Since voltage VA3 is about 0.55 v, transistor T5A is "off." In addition, Schottky diode LA is "off" because voltages VA3 and VA4 at nodes A3 and A4, respectively, are approximately equal to 0.55 v.

DC State for Input=DOWN Level

When the input level applied to transistor T1A is a DOWN level, i.e. 0.55 v, the circuit output at node A4 will be an UP level, i.e. 1.35 v. Since the input at the base of transistor T1A is 0.55 v, T1A is "off" and no current flows therethrough. Thus, voltage VA1 at node A1 is equal to Vcc, i.e. 2.1 v. Since no current flows through transistor T1A, node A2 is at ground. In addition, transistor T4A is "on" and the base-to-emitter voltage thereof is slightly less than 0.75 v, i.e. approximately 0.725 v. This results in the output at node A4 being equal to 1.35 v. In accordance with the Ic and base-to-emitter voltage rule explained above, the collector current through transistor T4A is approximately 30 ua.

Voltage VA3 at node A3 is 0.7 v. Thus the base-to-emitter voltage of transistor T5A is 0.7 v. As a result, T5A is at the edge of conduction, i.e. it is barely on. This, in turn, provides that the current flowing through T5A is approximately 20 ua, in accordance with the Ic and base-to-emitter voltage rule explained above.

The current through resistor R4A is approximately 10 ua, i.e. (1.35–0.7)/64,000. A "current mirror" is formed by R4A, T3A and R3A in one leg and T5A in the other leg. The base-to-emitter voltage of T5A equals the base-to-collector voltage of T3A plus the voltage drop across R3A. Since R4A is much large than R3A, there is a negligible voltage drop across R3A. By using the voltage-current rule discussed above, if the voltage drop across R3A is approximately 0.05 v, the current flowing through T5A is four to five times that flowing through resistor R4A. This 10 ua current flowing through the base-to-collector junction of T3A forward biases it so that it has a diffusion capacitance in the range of 2–10 pf.

Now let us examine the transitions of the CCG circuit between the two dc states we have just described.

Transition from Input=DOWN level to Input=UP level

As the input switches from a DOWN level to an UP level, voltage VA1 at node A1 drops from 2.1 mv to 1.1 mv and voltage VA2 at node A2 rises from 0 to 0.6 mv.

Voltage VA3 at node A3 rises from 0.7 to 0.83 mv as a result of coupling the voltage rise at node A2 through base-to-collector diode T3A. Schottky diode LA is initially "off" since voltage VA3 is initially 0.7 v and output voltage VA4 is initially 1.35 v. However, voltage VA4 drops as voltage VA1 drops. At the point that voltage VA4 drops to approximately 0.3 v, Schottky diode LA turns "on" because voltage VA3 has climbed to approximately 0.83 mv. Now, the base-to-emitter voltage for transistor T5A is 0.83 mv. As a result, and in accordance with the above discussed relationship, there is over 1 ma flowing through T5A, i.e. it has turned "on" hard.

Since Schottky diode LA is now "on," as voltage VA4 drops, Schottky LA drags voltage VA3 along and thus lowers it. As voltage VA3 is dragged lower, in accordance with the above-discussed rule, the current through transistor T5A is reduced and T5A starts to turn "off." As T5A starts to turn "off," voltage VA4 slowly rises toward 0.55 v. As a result of the rise of voltage VA4 to 0.55 v, T3A turns "off" and further current flow occurs through R4A until T5A is "off." At this point the capacitance of base-to-emitter diode T3A has been reduced and the circuit looks like the DC Input=UP level described hereinabove.

Transition from Input=UP level to Input=DOWN level

As the input switches from an UP level to a DOWN level, voltage VA1 at node A1 rises from 1.1 v toward 2.1 mv and voltage VA2 at node A2 drops from 0.6 v towards 0 v. Since the diffusion capacitance of transistor T3A was initially 0.1 pf, there is very little coupling between node A2 and node A3. Thus, transistor T5A remains "off." As voltage VA1 rises from 1.1 v to 2.1 v, the output voltage VA4 at node A4 rises from 0.55 v to 1.35 v as transistor T4A turns "on" and draws more current.

Figure 2:
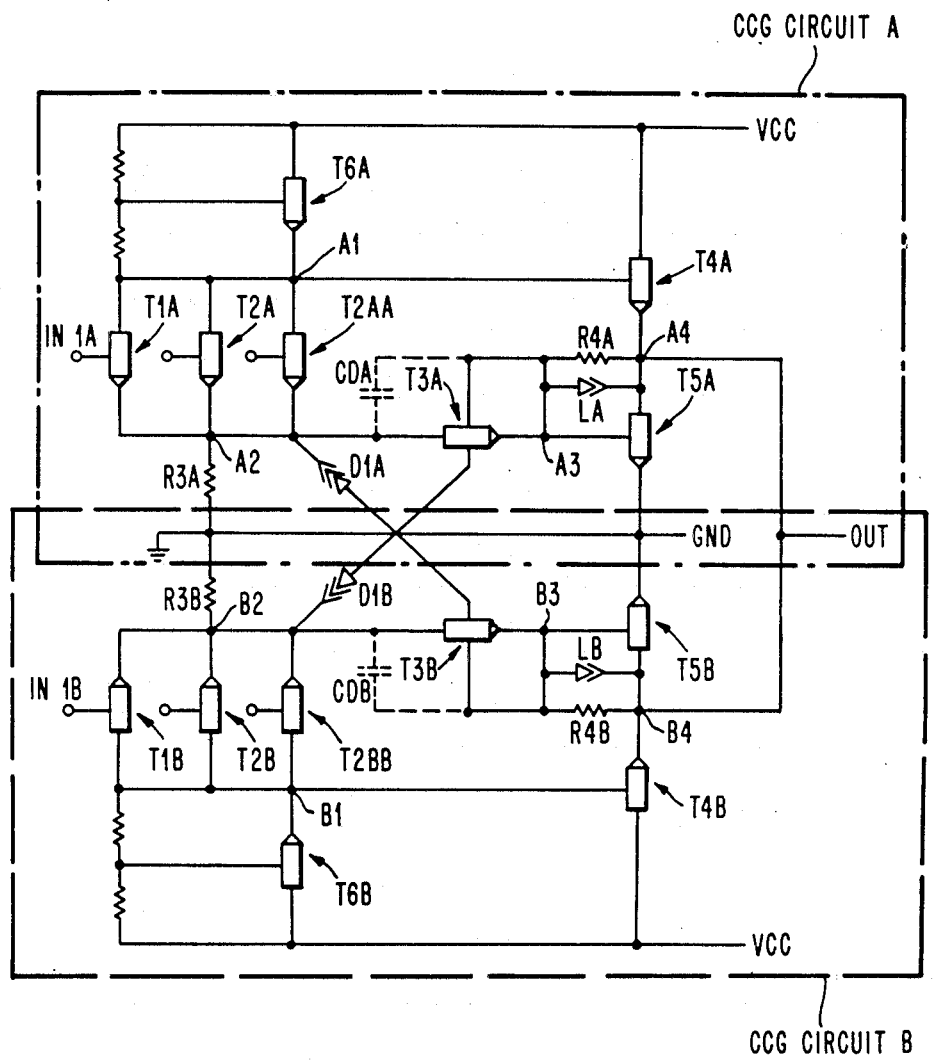
FIG. 2 shows, in pictorial form, a circuit diagram of dotted CCG circuits fabricated in accordance with the present invention.

Now we will describe the inventive dotted CCG circuit shown in FIG. 2. As shown in FIG. 2, there are three inputs to each CCG circuit; T1A, T2A, T2AA and T1B, T2B, and T2BB, respectively. For ease of understanding, and without loss of generality, we will take two of the inputs on each CCG circuit to be a DOWN level, i.e. the inputs to T2A, T2AA, T2B, and T2BB will all be taken to be a DOWN level. In this case, the third input to each CCG circuit determines the output of each CCG circuit. In addition, for sake of having a concrete example with which to frame the discussion, and without loss of generality, as before we will assume a DOWN level corresponds to approximately 0.55 v, an UP level corresponds to approximately 1.35 v, and the power supply voltage, Vcc, corresponds to approximately 2.1 v.

For the dotted CCG circuits shown in FIG. 2, Table 1 indicates the logical levels of the inputs and the output, the operating condition of cross-coupled Schottky diodes D1A and D1B, and the capacitances CDA and CDB of base-to-collector diodes T3A and T3B, respectively. In Table 1, IN1A and IN1B are inputs to transistors T1A and T1B of CCG circuits A and B, respectively; D1A and D1B are cross-coupled Schottky diodes from CCG circuit B to A and vice versa, respectively; CDA and CDB are the capacitances of base-to-collector diodes T3A and T3B of CCG circuits A and B, respectively; and OUT is the "dotted or" output of the inventive circuit.

TABLE 1

| STATE | IN1A | IN1B | D1A | D1B | CDA | CDB | OUT |
|---|---|---|---|---|---|---|---|
| (a) | DOWN | DOWN | ON | ON | .1 pf | .1 pf | UP |
| (b) | DOWN | UP | ON | OFF | 5 pf | .1 pf | UP |
| (c) | UP | DOWN | OFF | ON | .1 pf | 5 pf | UP |
| (d) | UP | UP | OFF | OFF | .1 pf | .1 pf | DOWN |

As will be explained hereinbelow, the dotting of CCG circuits without cross-coupled Schottky diodes produces high current flows during the following transitions: the transition from state (a) where IN1A=DOWN and IN1B=DOWN to state (b) where IN1A=DOWN and IN1B=UP; and the transition from state (a) where IN1A=DOWN and IN1B=DOWN to state (c) where IN1A=UP and IN1B=DOWN. Note that these two transitions occur from an initial state which has DOWN level inputs, one to each circuit, to a final state where one of the DOWN level inputs has changed to an UP level.

We will first describe the problem that occurs when CCG circuits, like that shown in FIG. 1, are merely dotted, i.e. the output nodes connected, without the cross-coupled Schottky diodes of the present invention. Assume the following: IN1A and IN1B are initially 0.55 v, i.e. in a DOWN level and then IN1A goes to 1.35 v, i.e. a transition to an UP level. These conditions correspond to a transition from state (a) to state (c) of Table 1.

In accordance with the previous discussion of the CCG circuit, when IN1A and IN1B are DOWN, transistors T1A and T1B are both "off" and voltages VA1 and VB1 at nodes A1 and B1, respectively, are Vcc, or 2.1 v. When IN1A is switched to an UP level, transistor T1A turns "on" and voltage VA1 drops from 2.1 v to 1.1 v, as explained hereinabove. As a result, transistor T4A turns "off."

Voltage VA2 at node A2 rises as the result of being the output of the emitter follower formed by transistor T1A. As explained above, CDA, the capacitance of base-to-collector diode T3A has a value of approximately 5 pf in order to couple voltage VA2 at node A2 to the input of active pull-down transistor T5A. Thus, as voltage VA2 rises, voltage VA3 at node A3 rises from 0.7 v to 0.83 v due to the coupling provided by the capacitance CDA of base-to-collector diode T3A. In turn, as voltage VA3 at node A3 rises, transistor T5A is turned "on" hard and a substantial amount of current flows through T5A. Note that Schottky LA does not conduct current and thereby lower voltage VA3 at node A3 because voltage VA4 at node A4 is higher than the 0.83 v of voltage VA3. Voltage VA4 is higher than 0.83 v because the output is high and, as a result, Schottky diode LA is "off."

The increased current drawn by transistor T5A is supplied by transistor T4B in CCG circuit B. Since T5A is turned "on" hard and draws a large current, a correspondingly large current flows through T4B. As a result, since voltage VB3 at node B3 is 2.1 v because transistor T1B is "off," the base-to-emitter voltage for transistor T4B must increase in order for T4B to supply the increased current for T5A. As a result of the increase in the base-to-emitter voltage for T4B, the dotted output voltage decreases.

The final result is that a large current flows through the circuit and the output voltage of the circuit decreases, even though, as an examination of the OUT column of Table 1 shows, the circuit output voltage should remain steady at 1.35 v, i.e. an UP level or a logical "1." The same problem occurs for the transition from state (a) to state (b) for the same reasons just discussed for the transition from state (a) to state (c).

In essence, the problem is caused by the fact that the capacitance of either base-to-collector diode T3A or T3B has a large value when the transition between these states occurs. This capacitance couples to the respective active pull-down transistor T5A or T5B and turns it "on" hard.

The above-described problem is alleviated by the inventive circuit shown in FIG. 2. Cross-coupled Schottky diodes D1A and D1B provide a discharge path for charge stored within base-to-collector diodes T3B and T3A, respectively, whenever that diode is nonconducting.

In state (a) of Table 1, both Schottky diodes LA and LB are "on" and conducting. This reduces the capacitances CDA and CDB of base-to-collector diodes T3A and T3B, respectively, to low values, for example 0.1 pf as shown in Table 1. Schottky diodes LA and LB are "on" because of the following reasons. IN1A and IN1B are both at a DOWN level, i.e., 0.55 v. As a result, transistors T1A and T1B are "off" and voltages VA2 and VB2 at nodes A2 and B2, respectively are at ground. Output voltage VA4 at node A4 is 1.35 v and approximately 10 ua of current flows at node A4. Transistor T5A is "off." Thus, approximately 10 ua will flow through resistor R4A and from there through Schottky D1B. This will cause Schottky D1B to raise voltage VA3 of node A3 to approximately 0.55 v. Thus transistors T3A and T3B will have their base-to-collector voltage below conduction. As a result, capacitances CDA and CDB will be small.

Now we will describe the circuit operation during the transition where IN1A goes from a DOWN to an UP level, i.e. from 0.55 v to 1.35 v. Voltage VA1 at node A1 goes down from 2.1 v toward 1.1 v. As before, this drop in voltage suffices to turn transistor T4A "off." Voltage VA2 at node A2 rises to approximately 0.6 v as transistor T1A turns "on" and draws current. This rise in voltage VA2 suffices to turn Schottky diode D1A off. Voltage VA3 at node A3 is 0.55 v because Schottky diode D1B is on. Capacitance CDA is 0.1 pf and this is insufficient to substantially couple the rise in voltage VA2 at node A2 to the base of active pull-down transistor T5A. Thus, T5A remains "off."

Voltage VB1 at node B1 is 2.1 v since transistor T1B is "off." As a result, Transistor T4B is "on" and the base-to-emitter voltage of T4B is 0.75 v. Thus, the output voltage VB4 at node B4 is approximately 1.35 v, i.e. the output remains at an UP level or a logical "1" state.

Transistor T5B was initially "off." Hence, the current flowing through T4B flows through resistor R4B, then through base-to-collector diode T3B, and finally through resistor R3B to ground. This current flow raises voltage VB3 at node B3 from 0.55 v to 0.7 v. In so doing, active pull-down transistor T5B is brought to the edge of conduction and the capacitance CDB rises to 5 pf.

The circuit operation during the transition from state (a) to state (b) is the same as has been explained above and results in the configuration delineated in Table 1.

In state (b), voltage VA1 at node A1 is 2.1 v since the input at transistor T1A is 0.55 v, i.e. a DOWN level. T1A is therefore "off" and T4A is "on."

Transistor T1B is "on" because input IN1B is 1.35 v, i.e. an UP level. In this case, voltage VB1 at node B1 is 1.1 v and transistor T4B is "off." Voltage VB2 at node B2 is approximately 0.6 v since the base-to-emitter voltage for transistor T1A is 0.75 v.

Transistor T5A is at the edge of conduction and voltage VA3 at node A3 is 0.7 v. Thus, Schottky diode D1B is off. As a result, the charge cannot be drained from base-to-collector diode T3A and capacitance CDA has a value of 5 pf.

However, voltage VA2 is at ground since transistor T1A is "off." Voltage VB3 at node B3 is approximately 0.55 v and Schottky diode D1A is "on", therefore the charge is drained from base-to-collector diode T3B and capacitance CDB has the small value of 0.1 pf.

Now we will describe the circuit operation during the transition from state (b) to state (d). Input IN1A to T1A rises to 1.35 v, i.e. the transition to an UP level and voltage VA1 at node A1 drops from 2.1 v toward 1.1 v. Voltage VA2 at node A2 rises from ground to approximately 0.6 v and is coupled through the capacitance CDA of base-to-collector diode T3A to node A3. As a result, voltage VA3 rises from 0.7 to 0.83 v. The rise in voltage VA2 at node A2 shuts off Schottky D1A. Current starts flowing through transistor T5A which is desirable since the objective is to switch the output rapidly from 1.35 v to 0.55 v. The dotted configuration performs in its intended manner, similar to a single CCG circuit.

In the case that both inputs IN1A and IN1B are switched to an UP level simultaneously, capacitances CDA and CDB both have low values. Therefore, both active pull-down transistors, T5A and T5B, are turned "on" lightly and the circuit does not react as quickly as it does for the transitions from state (b) to state (d) and from state (c) to state (d).

Figure 3:
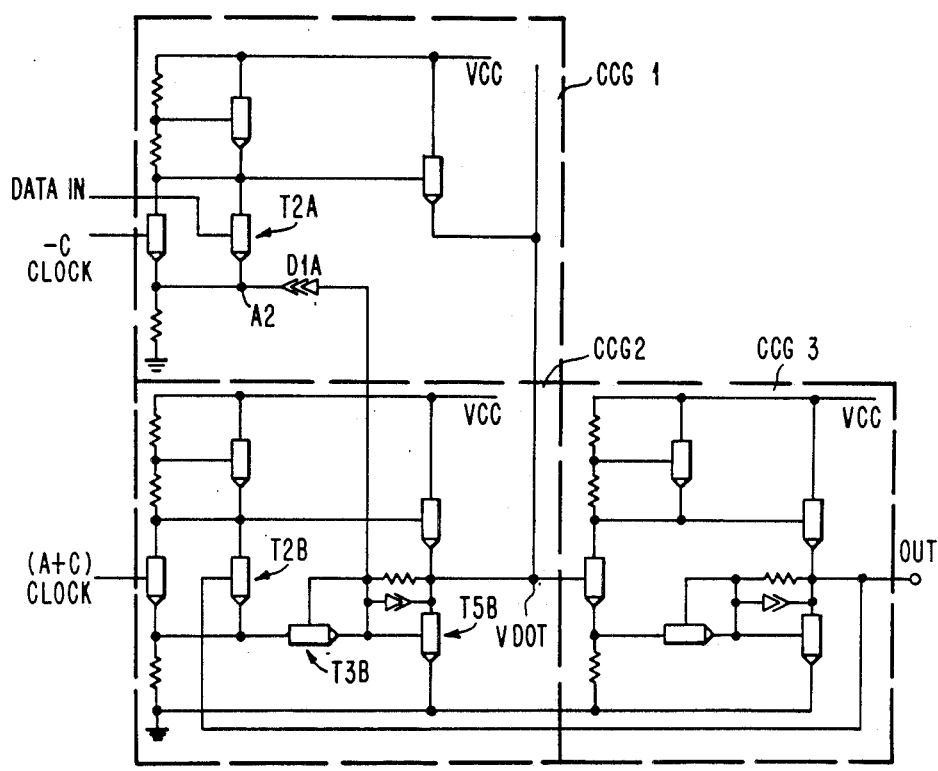
FIG. 3 shows, in pictorial form, a circuit diagram of a latch comprising dotted CCG circuits.

An inventive latch circuit comprising dotted CCG circuits is shown in FIG. 3. The latch functions so that, in conjunction with appropriate clock signals, the DATA IN signal applied to CCG1 is stored in the latch. This means that (1) when DATA IN is applied to CCG1, the latch output, i.e. OUTPUT, is equal to DATA IN and (2) that if DATA IN is removed from CCG1, CCG2 will operate so that OUTPUT remains equal to the applied value of DATA IN. Thus, the latch operates, in conjunction with appropriate clock signals, so that DATA IN is "stored" in the circuit combination comprising CCG2 and CCG3.

The nomemclature used in FIG. 3 is such that −C clock is a down going clock signal, i.e. it goes from a "1" to a "0" and then, after an interval, back to a "1."

We will now discuss the two latch input operations: (1) write a "1" into the latch and (2) write a "0" into the latch. First note that CCG3 in FIG. 3 acts as an inverter, i.e. OUTPUT is merely the complement of the dotted output of CCG1 and CCG2, Vdot.

Write "1"

When −C clock is applied to CCG1, the −C clock input goes to a "0." As a result the output of CCG1 is the complement of DATA IN. Since we are writing a "1," DATA IN goes to a "1." As a result, in accordance with the above-described operation of CCG circuits, T2A is "on" and voltage VA2 at node A2 is higher than ground. Thus, Schottky diode D1A is "off" and base-to-collector diode T3B has a capacitance of approximately 5 pf.

At CCG2, +C clock goes to a "1" when −C goes to a "0." (This operation assumes that the −C clock goes to a "0" before the +C clock goes to a "1") Therefore, the high diffusion capacitance of base-to-collector diode T3B causes Vdot to switch rapidly to a "0" state in accordance with the normal behavior of a CCG circuit.

Now we examine the "store" of the "1" in CCG2. OUTPUT, which equals "1," is fed back to transistor T2B of CCG2. −C clock goes back to a "1" and +C clock goes to a "0." (This operation assumes that the −C clock goes to a "1" after the +C clock goes to a "0") Thus, the output of CCG2 is determined by the input to T2B, which, in this case, is a "1." Also since −C clock is now a "1," the output of CCG1 is not dependent on DATA IN. In this manner, the "1" was written into the latch because DATA IN may be removed and the latch output will remain "1."

Write "0"

When −C clock is applied to CCG1, the −C clock goes to a "0." As a result the output of CCG1 is the complement of DATA IN. Since we are writing a "0," DATA IN goes to a "0." As a result, in accordance with the above-described operation of CCG circuits, T2A goes "off" and voltage VA2 goes down towards ground. This turns Schottky diode D1A "on" and discharges the diffusion capacitance of base-to-collector diode T3B. As a result the capacitance may have a value in the range of 0.1 pf. Therefore, when the +C clock goes to a "1," Vdot stays a "1" and the large current condition caused by transiently turning on pull-down transistor T5B is avoided because Schottky diode D1A is "on." (This operation assumes that the −C clock goes to a "0" before the +C clock goes to a "1") Also, Vdot is "1" because DATA IN is "0," and as a result, OUTPUT is a "0."

Now we examine the "store" of the "0" in CCG2. OUTPUT, which equals "0," is fed back to transistor T3B of CCG2. −C clock goes back to a "1" and +C clock goes to a "0." (This operation assumes that the −C clock goes to a "1" after the +C clock goes to a "0") Thus, the output of CCG2 is determined by the input to T2B, which, in this case, is a "0." Also since −C clock is now a "1," the output of CCG1 is not dependent on DATA IN. In this manner, the "0" was written into the latch because DATA IN may be removed and the latch output will remain "0."

Clearly, those skilled in the art recognize that further embodiments of the present invention may be made without departing from its teachings.

What is claimed is:

1. A dotted "or" logic circuit which comprises:
at least a first and a second current-controlled gate (CCG) circuit, each comprising an input section which includes at least one bipolar input transistor, an output section for making a dotted "or" connection, and means for coupling the input section to the output section, the coupling means having a capacitance, and
a first and a second discharging means, the first discharging means being connected at one end to the coupling means of the first CCG circuit and at the other end to the emitter of the at least one input transistor of the second CCG circuit, the second discharging means being connected at one end to coupling means of the second CCG circuit and at the other end to the emitter of the at least one input transistor of the first CCG circuit.

2. A dotted "or" logic circuit in accordance with claim 1 wherein the coupling means is a diode.

3. A dotted "or" logic circuit in accordance with claim 2 wherein the diode is the base-to-collector junction of a bipolar transistor which has its base and emitter short-circuited.

4. A dotted "or" logic circuit in accordance with claim 3 wherein the discharging means is a Schottky diode.

5. A latch circuit which comprises:
at least one first current-controlled gate (CCG) circuit comprising an input section which includes at least two bipolar input transistors, and an output section coupled to said input section, a second CCG circuit comprising an input section which includes at least two inputs, an output section, and means for coupling the input section to the output section, the coupling means having a capacitance, the output sections of the first and second CCG circuits being dot "or"ed to provide a first output, the first output being input to an inverter to provide a second output, the second output being connected to one of the at least two inputs of the second CCG circuit, and a discharging means being connected at one end to the coupling means of the second CCG circuit and at the other end to the emitter of one of the at least two input transistors of the at least one first CCG circuit.

6. A latch in accordance with claim 5 wherein the coupling means is a diode.

7. A latch in accordance with claim 6 wherein the diode is the base-to-collector junction of a bipolar transistor which has its base and emitter short-circuited.

8. A latch in accordance with claim 7 wherein the discharging means is a Schottky diode.

9. A latch in accordance with claim 8 wherein the inverter is a CCG circuit.

* * * * *